(12) United States Patent
Yuksel Ergun et al.

(10) Patent No.: US 9,779,185 B2
(45) Date of Patent: Oct. 3, 2017

(54) TEST AND ANALYSIS SYSTEM AND A METHOD FOR THREAT EVALUATION AND SENSOR/WEAPON ASSIGNMENT ALGORITHMS

(71) Applicant: ASELSAN ELEKTRONIK SANAYI VE TICARET ANONIM SIRKETI, Ankara (TR)

(72) Inventors: Inci Yuksel Ergun, Ankara (TR); Melih Gunay, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 854 days.

(21) Appl. No.: 14/241,076

(22) PCT Filed: Mar. 25, 2013

(86) PCT No.: PCT/IB2013/052367
§ 371 (c)(1),
(2) Date: Feb. 25, 2014

(87) PCT Pub. No.: WO2013/153471
PCT Pub. Date: Oct. 17, 2013

(65) Prior Publication Data
US 2014/0200875 A1    Jul. 17, 2014

(30) Foreign Application Priority Data

Apr. 11, 2012    (TR) .................................. 2012/04156

(51) Int. Cl.
*G06G 7/48*     (2006.01)
*G06F 17/50*    (2006.01)
(Continued)

(52) U.S. Cl.
CPC ........... *G06F 17/5009* (2013.01); *F41G 3/04* (2013.01); *F41G 3/26* (2013.01); *F41G 3/32* (2013.01);
(Continued)

(58) Field of Classification Search
CPC .... G06F 17/5009; G06Q 50/26; G06Q 10/06; F41G 3/04; F41G 3/26; F41G 3/32; F41G 9/00
(Continued)

(56) References Cited

U.S. PATENT DOCUMENTS 5,992,288 A    11/1999    Barnes
6,497,169 B1 *    12/2002    Khosla ..................... F41G 3/04
                                                        702/144
(Continued)

FOREIGN PATENT DOCUMENTS

EP    2239533    10/2010

OTHER PUBLICATIONS

Jolene Marshall et al., An Analysis of the Open Architecture Warfare System Domain Model for surface time critical targets, 2007, Diss. Monterey, California. Naval Postgraduate School, pp. 1-207.*
(Continued)

*Primary Examiner* — Juan Ochoa
(74) *Attorney, Agent, or Firm* — Gokalp Bayramoglu

(57) ABSTRACT

The present invention relates to a system comprising threat evaluation and sensor/weapon assignment algorithm operating units which are adapted such that they will operate any threat evaluation and sensor/weapon assignment algorithm, a simulation and analysis unit which is adapted such that it will form the area, in which threat evaluation and sensor/weapon assignment algorithms will be operated, as a virtual scenario by forming an air picture in accordance with the data it receives, an external communication unit which is in
(Continued)

Figure 1:
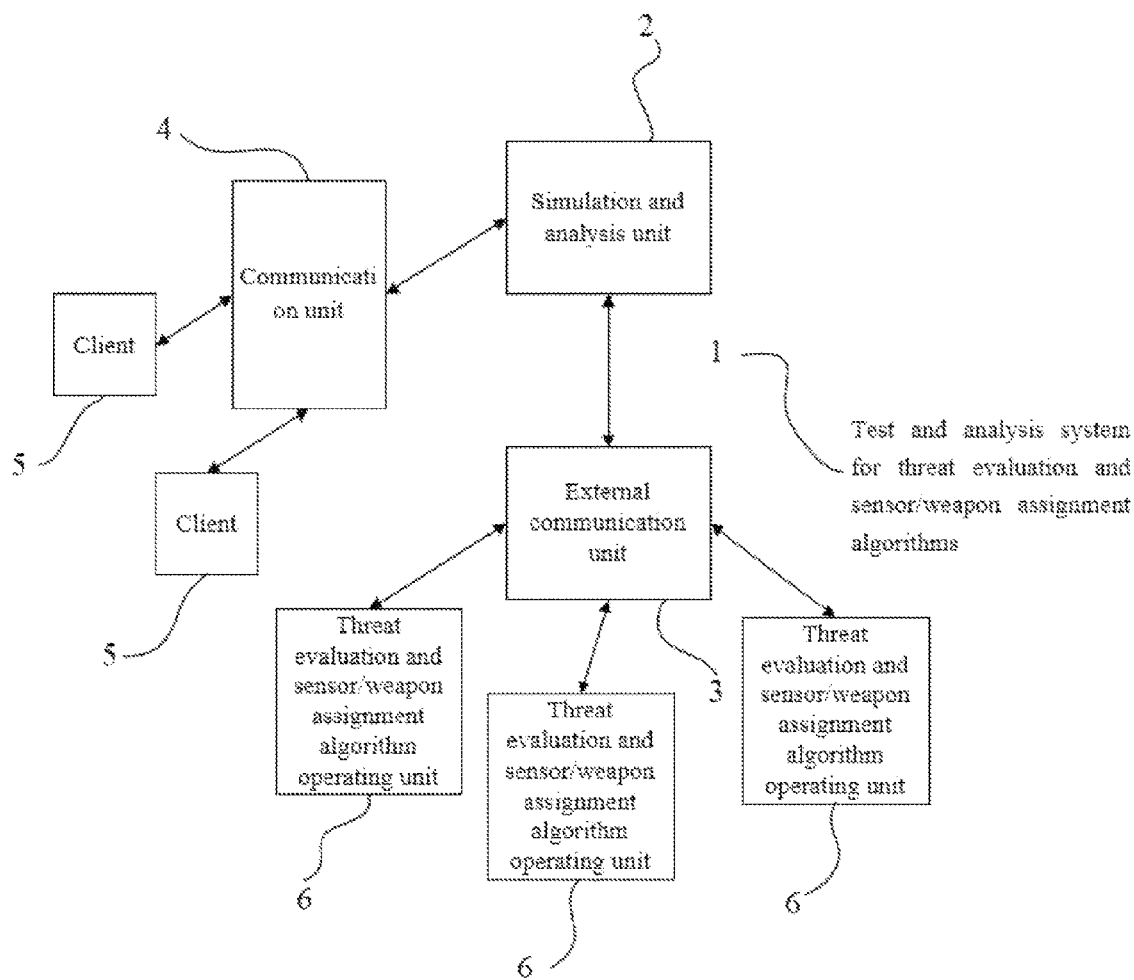

communication with the simulation and analysis unit; which can communicate correspondingly with a threat evaluation and sensor/weapon assignment algorithm operating unit; which is adapted such that it will transfer the current scenario information to the threat evaluation and sensor/weapon assignment algorithm when it is necessary and transfer the engagement results to the simulation and analysis unit by taking them back, and a communication unit which is adapted such that it will transfer the scenario, which is formed by communicating with a client, to the client and will receive data through the client; and a method comprising the steps of sending and arranging the data to the simulation and analysis unit through at least one client, transferring the virtual scenario to the TESWA algorithm operating units and receiving the engagement data, combining the engagement data with each other and the data received from the clients and updating the scenario status, approving and disapproving the engagement, analyzing the engagement data and transferring the results to a client partially or completely.

15 Claims, 2 Drawing Sheets

(51) Int. Cl.
| | |
|---|---|
| *F41G 3/04* | (2006.01) |
| *F41G 3/26* | (2006.01) |
| *F41G 3/32* | (2006.01) |
| *F41G 9/00* | (2006.01) |
| *G06Q 10/06* | (2012.01) |
| *G06Q 50/26* | (2012.01) |

(52) U.S. Cl.
CPC ............... *F41G 9/00* (2013.01); *G06Q 10/06* (2013.01); *G06Q 50/26* (2013.01)

(58) Field of Classification Search
USPC .............................................. 703/6
See application file for complete search history.

(56) References Cited

U.S. PATENT DOCUMENTS

| | | | |
|---|---|---|---|
| 7,908,040 B2* | 3/2011 | Howard | ............... G05D 1/0094 701/1 |
| 7,912,631 B2* | 3/2011 | Howard | ............... F41G 3/04 701/519 |
| 2004/0030449 A1* | 2/2004 | Solomon | ............... B64C 39/024 700/245 |
| 2007/0168117 A1 | 7/2007 | Howard | |
| 2011/0271822 A1* | 11/2011 | Myr | ............... G06Q 10/06 89/1.11 |

OTHER PUBLICATIONS

S. J. Miller, Distributed Operating Systems for Combat Systems, 1994, No. DSTO-TR-0060, Defence Science and Technology Organization Canberra (Australia), pp. 1-28.*

Adam Brook: "UK Experiences of Using Coalition Battle Management Language", Distributed Simulation and Real Time Applications(DS-RT), 2011 IEEE/ACM 15th International Symposium on, IEEE, Sep. 4, 2011 (Sep. 4, 2011), pp. 160-647,XP032063990, DOI:10.1109/DS-RT.2011.25 ISBN:978-1-4577-1643-0 abstract;Figure 1,2 p. 161-p. 164.

Mark Pullen J et al: "Maturing Supporting Software for C2-Simulation Interoperation",Distributed Simulation and Real Time Applications(DS-RT), 2011, IEEE/ACM 15th International Symposium on, IEEE, Sep. 4, 2011 (Sep. 4, 2011), pp. 148-154, XP032063988, DOI: 10.1109/DS-RT.2011.20 ISBN: 978-1-4577-1634-0 the whole document.

* cited by examiner

TEST AND ANALYSIS SYSTEM AND A METHOD FOR THREAT EVALUATION AND SENSOR/WEAPON ASSIGNMENT ALGORITHMS

FIELD OF THE INVENTION

The present invention relates to a system and methods wherein the tests and analysis are conducted on how they cooperate by operating the threat evaluation and sensor/weapon assignment (TESWA) algorithms together.

BACKGROUND OF THE INVENTION

As it is known, the location of the vehicles in the airspace can be identified with for example data received from various sensors (radar etc.), the points to be protected at certain locations and each target that can pose danger by knowing the locations and abilities of weapons firing gun into the air can be determined and be associated with the said weapons, by this means an optimum solution is generated and sensors and air vehicles can be associated and engagements can be formed with various threat evaluation and sensor/weapon assignment (TESWA) algorithms. In this way, each weapon and its operator know which targets are their concern, and start fire if it is suitable and upon command.

Such algorithms can use data such as weapon locations, abilities, radar data, command hierarchy, engagement approval or refusal of the weapon operator; as a result report the engagements. The said engagement results generally can be approved or refused by a weapon operator or a commander, or a commander can form a new engagement. The inputs can be transferred to the systems operating the algorithms in text files or through a specialized messaging interface.

Testing and analyzing the said algorithms is possible with the present methods, however in some cases there is a need for using various algorithms together in such defense coordination solutions (for example multinational/multi stakeholder cases). However, in these cases the algorithms should be controlled if they can operate together, and the TESWA algorithms should be tested and analyzed if they can operate together in different command levels.

This case requires that the different algorithms should be reorganized and amended as one single algorithm in order to make the analyses possible, and the said arrangements prevents checking if the algorithm can operate with the others or not. Especially in cases wherein the algorithm contents of various firm and/or nations are wanted to be kept confidential, the said solution is not a valid method in defense systems performed as multinational/multi stakeholder. On top of it, forming a one single algorithm by gathering various algorithms require compilation of all algorithms to be used together, and this cause increase in time and cost as well as it makes the situation more difficult if a new algorithm needs to be added.

Another disadvantage seen upon combining algorithms is the difficulty of routing the algorithms by including the situations that can be originated from the user interaction to the setup effectively. There is no test and analysis system in the state of the art, in which the user decisions can be modeled, various operating levels are defined, which can operate on more than one computer in a distributed way, which enables to test and analyze the interoperability fast and effectively for threat evaluation and sensor/weapon algorithms.

United States Patent document no US20110271822, an application in the state of the art, discloses a real time optimum command and control system and a method wherein the control functions are performed through the personnel, equipment, communication engagements.

European Patent document no EP2239533, an application in the state of the art, discloses a system and a method assigning at least one weapon to at least one threat wherein data on weapon and threats are received and processed in order to select any one of the system weapon assignment techniques.

SUMMARY OF THE INVENTION

The objective of the present invention is to provide a test and analysis system and a method for threat evaluation and sensor/weapon assignment algorithms which can test and analyze the interoperability of TESWA algorithms comprising confidential information of a plurality of institution/company/nation fast and effectively.

Another objective of the present invention is to provide a test and analysis system and a method for threat evaluation and sensor/weapon assignment algorithms which can communicate with the standard interfaces independent from the algorithm and which can model the user decisions by enabling the interaction of the users from various operating levels.

DETAILED DESCRIPTION OF THE INVENTION

A test and analysis system and a method for threat evaluation and sensor/weapon assignment algorithms developed to fulfill the objective of the invention is illustrated in the accompanied figures, wherein FIG. 1 is the schematic view of the inventive test and analysis system for threat evaluation and sensor/weapon assignment algorithms.

Figure 2:
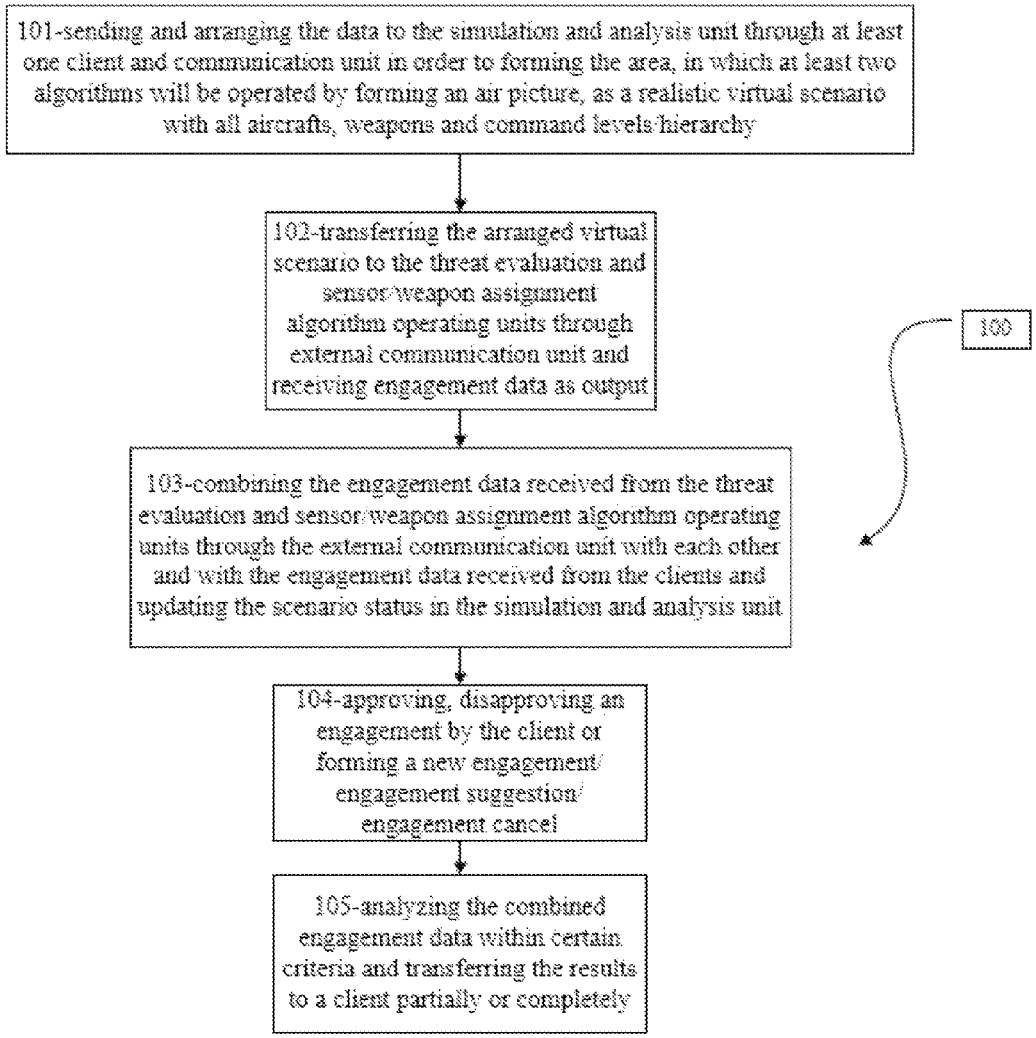

FIG. 2 is the flowchart of the inventive test and analysis method for threat evaluation and sensor/weapon assignment algorithms.

The components in the figures are assigned reference numerals as follows:
1. Test and analysis system for threat evaluation and sensor/weapon assignment algorithms
2. Simulation and analysis unit
3. External communication unit
4. Communication unit
5. Client
6. Threat evaluation and sensor/weapon assignment algorithm operating unit A test and analysis system for threat evaluation and sensor/weapon assignment algorithms (1) enabling the interoperability to be tested and analyzed fast and effectively comprises

- at least two threat evaluation algorithm operating units (6) which are adapted such that they will operate any threat evaluation and sensor/weapon assignment algorithm,
- at least one simulation and analysis unit (2) which is adapted such that it will form the area, in which threat evaluation and sensor/weapon assignment algorithms will be operated, as a virtual scenario by forming an air picture in accordance with the data it receives,
- at least one external communication unit (3) which is in communication with the simulation and analysis unit (2); which can communicate correspondingly with a threat evaluation and sensor/weapon assignment algorithm operating unit (6); which is adapted such that it will transfer the current scenario information to the threat evaluation and sensor/weapon assignment algorithm (6) when it is necessary and transfer the engagement results to the simulation and analysis unit (2) by taking them back, at least one communication unit (4) which is in communication with the simulation and analysis unit (2), and which is adapted such that it will transfer the scenario formed by communicating with at least one client (5) corresponding to a weapon operator or a commander in the simulation to the client (5) if it is authorized and will receive data through the client if it is authorized. (FIG. 1)

Threat evaluation and sensor/weapon assignment algorithm operating unit (6) adapted such that it will operate a threat evaluation and sensor/weapon assignment algorithm represents at least two threat evaluation and sensor/weapon assignment algorithms different from each other that will be operated on the said simulation and analysis system, and it is a unit which can operate any software or hardware based TESWA algorithm. For example, algorithms operated in different computers can be included into the system as well as all these algorithms can be uploaded to a single computer and can be operated without opening a source code.

Since the threat evaluation and sensor/weapon assignment algorithm operating unit (6) is in communication with the simulation and analysis unit (2), scenario information is transferred to the algorithm and the engagement results can be received back by the simulation and analysis unit (2). In order to perform this function there is at least one external communication unit (3) which is also in communication with the simulation and analysis unit (2) and which can communicate with the threat evaluation and sensor/weapon assignment algorithm operating unit (6); and which adapted such that it will transfer the current scenario information when it is necessary and receive the engagement results. The external communication unit (3) is responsible for communicating with the threat evaluation and sensor/weapon assignment algorithm operating units (6), in a preferred embodiment of the invention it is adapted such that it will operate with an extensive input-output cluster. In this context, an extensive information comprises all data any TESWA algorithm may need (for example the location, position and route received from the radars in reality, location and abilities of weapons, commander approvals and/or authorization levels and relations, engagement data etc), and the necessary data are written at necessary placed with an interface arrangement add-on present in the threat evaluation and sensor/weapon assignment algorithm operating unit (6). Similarly, the results received from the algorithm is received by the external communication unit (3) as an extensive output comprising all outputs which any TESWA algorithm can give. The current scenario data are obtained by using the data received from the threat evaluation and sensor/weapon assignment algorithm operating units (6) in the simulation and analysis unit (2) and the engagement approval/disapproval or manual engagement/engagement suggestion/engagement cancellation data.

In another preferred embodiment of the invention, the external communication unit (3) is adapted such that it will prevent the waiting caused by the different threat evaluation and sensor/weapon assignment algorithm operating units (6) making transactions in different times, and the data are received from the threat evaluation and sensor/weapon assignment algorithm operating units (6) without delay in necessary time.

Simulation and analysis unit (2), which identifies with a real environment and which is adapted such that it will form a scenario by forming an air picture virtualizing the data received from various sensors, and which is communication with the external communication unit (3), is also adapted such that it will update the scenario data in real-time by using data received from the threat evaluation and sensor/weapon assignment algorithm operating units (6) and engagement approval/refusal or manual engagement/engagement suggestion/engagement cancel data received from the client (5). The said virtual environment preferably comprises air space and on ground weapons and assets (areas/facilities to be protected such as command center, radar, bridge etc.), and all data are kept together with information of the environment (for example map, day/night situation, meteorological conditions) and scenario information (command hierarchy etc) next to three dimensional coordinate and speed information. Displaying the said virtual environment on any imaging device realistically and thus the clients (5) behaving as if they were really in the said environment can be possible.

The client (5) corresponding to a weapon operator or commander in the simulation is connected to the simulation and analysis unit (2) through the communication unit (4). Real time scenario display can be performed with 2 or 3 dimension coordinate data made possible with the simulation and analysis unit (2). In a preferred embodiment of the invention, the client (5) can connect to the communication unit (4) through a computer which is connected to the simulation and analysis unit (2) through a network, and can have the scenario watched within the user authorization.

For example, a weapon operator can watch the field with a virtualized video camera, thermal camera or his own eyes on side of his weapon. This situation also requires knowing night/day, meteorological conditions and the features of electro/opto systems on the weapons as scenario inputs. The client (5), which is preferably software based, is adapted such that it can display the scenario status in real time with 2 or 3 dimension in terms of the authorization of the user (for example the user is assigned as a weapon operator or a commander), present the engagements for approval, enable to make new engagement/engagement suggestion/engagement cancel record or scenario change. When applied on a computer, the client (5) can be operated in more than one number (for example on different displays) on a single device or different clients can be operated distributedly on different computers/devices. In a preferred embodiment of the invention, the client (5) is adapted such that the user can enter scenario information depending on the authorization levels again. The data that can be required for the scenario and that are entered depending on time can be, for example, 3 dimension threat trajectory, weapon locations and specifications, locations, size and values of the area/asset to be protected, sensor locations and specifications as well as the above. The said data can be entered into the system depending on time by using 2 or 3 dimension displays on the satellite pictures. Preferably, the client (5) is adapted such that it will control whether the entered data are realistic. For example, if a threat trajectory which is entered comprises sudden folds, the user who makes enter is warned and/or the error is corrected automatically.

In another embodiment, the client (5) is adapted such that it can approve or disapprove the engagements according to the given possibilities by operating automatically. In this case, the engagements at a certain rate will be approved or disapproved in the client (5). In another embodiment instead of approving within the possibilities, approval/disapproval processes are performed automatically with a certain delay. For example, when approval time for commander is adjusted as 20-30 seconds, the said client (5) can give approval in every 20-30 seconds. By this mean, the necessity of the presence of a real person in each terminal continuously is eliminated.

A test and analysis method for threat evaluation and sensor/weapon assignment algorithms (100) developed to fulfill the objectives of the invention essentially comprises the steps of sending and arranging the data to the simulation and analysis unit (2) through at least one client (5) and communication unit (4) in order to forming the area, in which at least two algorithms will be operated by forming an air picture, as a realistic virtual scenario with all aircrafts, weapons and command levels/hierarchy (101), transferring the arranged virtual scenario to the threat evaluation and sensor/weapon assignment algorithm operating units (6) through external communication unit (3) and receiving engagement data as output (102), combining the engagement data received from the threat evaluation and sensor/weapon assignment algorithm operating units (3) through the external communication unit (3) with each other and with the engagement data received from the clients (5) and updating the scenario status in the simulation and analysis unit (2) (103), approving, disapproving an engagement by the client (5) or forming a new engagement/engagement suggestion/engagement cancel (104), analyzing the combined engagement data within certain criteria and transferring the results to a client (5) partially or completely (105). (FIG. 2)

First, a realistic air picture is virtually formed with the scenario information received through the client (5) in step (101), and all aircrafts, weapons and command levels are determined. The algorithms operating in various threat evaluation and sensor/weapon assignment algorithm operating units (6) are assigned to the commanders and various authorization levels and hierarchic relations are assigned to the commanders in this step. The said data are arranged in the simulation and analysis unit (2), and an air scenario which can be operated in real time is formed.

In a preferred embodiment of the invention, the extensive output obtained from the virtual scenario in step (102) is transferred to the threat evaluation and sensor/weapon assignment algorithm operating units (6) through the external communication unit (3) in real time. In the meantime, the incompatibilities caused by the calculation differences of different algorithms should be considered. Therefore, TESWA algorithms make calculation by taking the real time status as input and present the engagement data to the system (1).

In step (103), the engagement data calculated by the threat evaluation and sensor/weapon assignment algorithm operating units (6) and received through the external communication unit (3) in different times are combined with each other and the other data coming from the clients (5), and updated in the simulation and analysis unit (2) such that the scenario status will represent the current status.

Then, in step (104) the client (5) approves or disapproves the engagement which is assigned to him (in case the client is a weapon operator, the target which is assigned to him or the target assignment authorized by its command level in case the client is a commander) within authorization, or a new engagement/engagement suggestion/engagement cancellation is performed through the client (5). In a preferred embodiment of the invention, the said process is performed automatically in any client (5) within the determined possibilities. In another embodiment instead of approving within the possibilities, in step (104) approval/disapproval processes are performed automatically with a certain delay. For example, when approval time for commander is adjusted as 20-30 seconds, the said client (5) can give approval in every 20-30 seconds.

The engagement data combined in step (105) are digitally analyzed, and the results are transferred to a client (5) who desires preferably within authorization partially or completely. The said results, for example, are the deterministic criteria for analyzing the interoperability such as non-engaged target number, engaging on a target more than once, engagement changes. When it is considered that the timing of various threat evaluation and sensor/weapon assignment algorithms are adjusted automatically and it will be unnecessary to calculate result without a request, it is obvious that steps (102), (103), (104) and (105) are performed when it is required.

As a result, the system (1) and the method (100) allow the results to be evaluated as if the result were in a real threat environment. A solution is provided which can perform test and analysis effectively and fast upon modeling and/or realizing various users by updating within the scenario, communicating with the standard interfaces independent from the algorithm with the received data.

Within the scope of this basic concept, it is possible to develop various embodiments of the inventive test and analysis system (1) and method (100) for threat evaluation and sensor/weapon assignment algorithms. The invention cannot be limited to the examples described herein and it is essentially as defined in the claims.

The invention claimed is:

1. A test and analysis system for threat evaluation and sensor/weapon assignment algorithms, enabling the interoperability to be tested and analyzed fast and effectively, the system comprising:

at least two threat evaluation and sensor/weapon assignment algorithm operating units for conducting operation on any threat evaluation and sensor/weapon assignment algorithm;

at least one simulation and analysis unit which is forming an area in which the threat evaluation and sensor/weapon assignment algorithms will be operated as a virtual scenario by forming an air picture in accordance with data it receives;

at least one external communication unit which is in communication with the simulation and analysis unit, for communicating correspondingly with the threat evaluation and sensor/weapon assignment algorithm operating units, and transferring current scenario information to the threat evaluation and sensor/weapon assignment algorithm and engagement results to the simulation and analysis unit; and at least one communication unit which is in communication with the simulation and analysis unit, for transferring the virtual scenario formed by communicating with at least one client corresponding to a weapon operator or a commander in the simulation to the client and receive data through the client;

wherein the threat evaluation and sensor/weapon assignment algorithms operated in different computers are included into the system as well as all the threat evaluation and sensor/weapon assignment algorithms are uploaded to a single computer and operated without opening a source code;

wherein the simulation and analysis unit updates the virtual scenario data in real-time by using the data received from the threat evaluation and sensor/weapon assignment algorithm operating units and engagement approval/refusal or manual engagement/engagement suggestion/engagement cancel data received from the client;

wherein approval and disapproval of the engagement is performed automatically by the client after predetermined delays, wherein the predetermined delays are 20-30 seconds, and the client gives approval in every 20-30 seconds.

2. The test and analysis system for threat evaluation and sensor/weapon assignment algorithms according to claim 1, wherein the external communication unit conducts operation with an extensive input-output cluster.

3. The test and analysis system for threat evaluation and sensor/weapon assignment algorithms according to claim 1 wherein the external communication unit prevents delays caused by the threat evaluation and sensor/weapon assignment algorithm operating units performing transactions in different times.

4. The test and analysis system for threat evaluation and sensor/weapon assignment algorithms according to claim 1, wherein a real-time scenario is displayed by the client.

5. The test and analysis system for threat evaluation and sensor/weapon assignment algorithms according to claim 4, wherein a 2 dimension scenario is displayed by the client.

6. The test and analysis system for threat evaluation and sensor/weapon assignment algorithms according to claim 4, wherein a 3 dimension scenario is displayed by the client.

7. The test and analysis system for threat evaluation and sensor/weapon assignment algorithms according to claim 1, wherein the client presents an engagement for approval and making new engagement/engagement suggestion/engagement cancel record or scenario change.

8. The test and analysis system for threat evaluation and sensor/weapon assignment algorithms according to claim 1, wherein the client is being operated in multiple numbers on a single device.

9. The test and analysis system for threat evaluation and sensor/weapon assignment algorithms according to claim 7, wherein the client conducts operation distributedly on different devices.

10. The test and analysis system for threat evaluation and sensor/weapon assignment algorithms according to claim 1, wherein the client is adapted to analyze the virtual scenario data, wherein the client is configured to send a warning message to indicate error in the virtual scenario data or correct the data automatically.

11. The test and analysis system for threat evaluation and sensor/weapon assignment algorithms according to claim 1, wherein the client conducts approving or disapproving engagements based on possibilities by operating automatically on its own.

12. The test and analysis system for threat evaluation and sensor/weapon assignment algorithms according to claim 1, wherein the client conducts approving or disapproving engagements with certain displays by operating automatically on its own.

13. A test and analysis method for threat evaluation and sensor/weapon assignment algorithms which enables a test and analysis system for threat evaluation and sensor/weapon assignment algorithms to operate the method comprising the steps of:

sending and arranging data to a simulation and analysis unit through at least one client and a communication unit, in which at least two algorithms are operated by forming an air picture, as a real-time virtual scenario with all aircrafts, weapons and command levels/hierarchy, transferring the real-time virtual scenario to threat evaluation and sensor/weapon assignment algorithm operating units through an external communication unit and receiving engagement data as output;

combining the engagement data received from the threat evaluation and sensor/weapon assignment algorithm operating units through the external communication unit with each other and with the engagement data received from the client and updating scenario status in the simulation and analysis unit;

approving or disapproving an engagement by the client or forming a new engagement/engagement suggestion/engagement cancel;

analyzing the combined engagement data within certain criteria and transferring the results to the client partially or completely;

wherein approval and disapproval of an engagement is performed automatically by the client after predetermined delays, wherein the predetermined delays are 20-30 seconds.

14. The test and analysis method for threat evaluation and sensor/weapon assignment algorithms according to claim 13, wherein approval and disapproval of an engagement is performed automatically in any client within predetermined possibilities.

15. The test and analysis method for threat evaluation and sensor/weapon assignment algorithms according to claim 13, wherein the engagement results are transferred to a desiring client within its authorization limits.

* * * * *